United States Patent
Herrmann

(10) Patent No.: US 10,541,357 B2
(45) Date of Patent: Jan. 21, 2020

(54) METHOD AND DEVICE FOR CYCLICAL OPERATION OF A THERMOELECTRIC CELL ARRANGEMENT

(71) Applicant: FAHRENHEIT GMBH, Munich (DE)

(72) Inventor: Ralph Herrmann, Halle (DE)

(73) Assignee: FAHRENHEIT GMBH, Munich (DE)

( * ) Notice: Subject to any disclaimer, the term of this patent is extended or adjusted under 35 U.S.C. 154(b) by 24 days.

(21) Appl. No.: 15/533,598

(22) PCT Filed: Nov. 23, 2015

(86) PCT No.: PCT/EP2015/077311
§ 371 (c)(1),
(2) Date: Jun. 6, 2017

(87) PCT Pub. No.: WO2016/091558
PCT Pub. Date: Jun. 16, 2016

(65) Prior Publication Data
US 2017/0365762 A1    Dec. 21, 2017

(30) Foreign Application Priority Data

Dec. 11, 2014 (DE) .......... 10 2014 018 453
Apr. 8, 2015 (DE) .......... 10 2015 004 524

(51) Int. Cl.
*H01L 35/30* (2006.01)
*H01L 35/34* (2006.01)
(Continued)

(52) U.S. Cl.
CPC .......... *H01L 35/30* (2013.01); *F25B 17/00* (2013.01); *H01L 35/34* (2013.01); *H01L 35/00* (2013.01);
(Continued)

(58) Field of Classification Search
CPC .......... F25B 17/00; H01L 35/00; H01L 35/30; H01L 35/32; H01L 35/34; H01L 37/00; Y02A 30/277; Y02B 30/62
See application file for complete search history.

(56) References Cited

U.S. PATENT DOCUMENTS 5,644,185 A    7/1997  Miller .......... 310/306

FOREIGN PATENT DOCUMENTS

DE    102008008652    8/2009  .......... F24J 2/46
GB    2172394    9/1986  .......... F24J 2/42
(Continued)

OTHER PUBLICATIONS

Notification Concerning Transmittal of International Preliminary Report on Patentability (Chapter I of the Patent Cooperation Treaty), in English, dated Jun. 22, 2017, which was issued by the International Bureau of WIPO in Applicant's corresponding international PCT application having Serial No. PCT/EP2015/077311, filed on Nov. 23, 2015.

(Continued)

*Primary Examiner* — Matthew T Martin
(74) *Attorney, Agent, or Firm* — Bodner & O'Rourke, LLP; Gerald T. Bodner; Christian P. Bodner

(57) ABSTRACT

The invention relates to a method for cyclical operation of a thermoelectric cell arrangement by periodically changing the temperature of the thermoelectric cell arrangement, wherein the thermoelectric cell arrangement is thermally coupled to a cyclically operated absorption heat pump. The following method steps are carried out cyclically: thermally coupling the thermoelectric cell arrangement during a cooling phase to a cold side of the absorption heat pump, thermally coupling the thermoelectric cell arrangement during a heating phase to a hot side of the absorption heat pump. The invention also relates to a harvester device for generating electrical energy by means of a thermoelectric cell arrangement, wherein the thermoelectric cell arrangement is thermally coupled to an absorption heat pump, wherein the thermal coupling makes it possible to effect, in time with the working cycle of the absorption heat pump, a temperature change in the thermoelectric cell arrangement.

12 Claims, 5 Drawing Sheets

Figure 1:
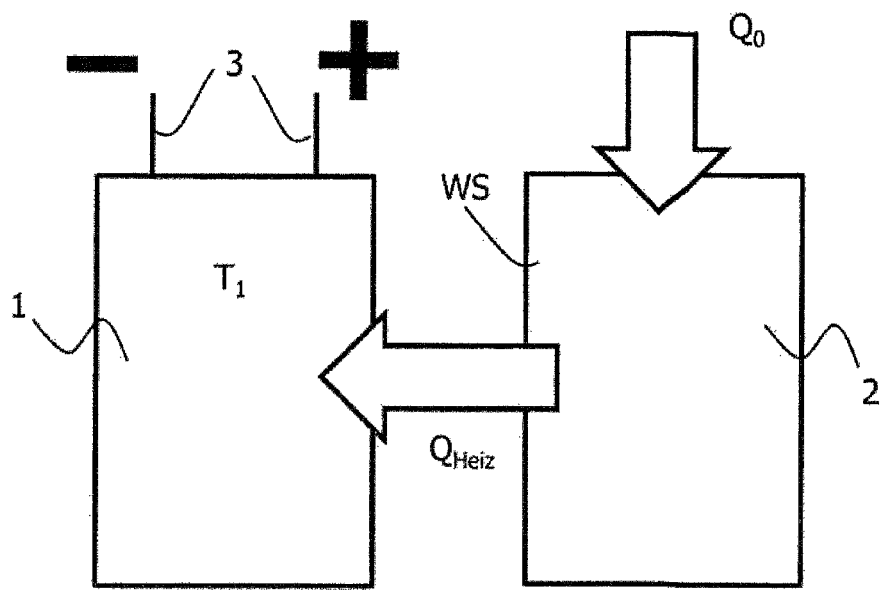

(51) Int. Cl.
  *F25B 17/00* (2006.01)
  *H01L 35/00* (2006.01)
  *H01L 35/32* (2006.01)
  *H01L 37/00* (2006.01)
(52) U.S. Cl.
  CPC .............. *H01L 35/32* (2013.01); *H01L 37/00* (2013.01); *Y02A 30/277* (2018.01); *Y02B 30/62* (2013.01)

(56) References Cited

FOREIGN PATENT DOCUMENTS

| JP | 2001/213149 | 8/2001 | ............... B60H 1/00 |
|----|----|----|----|
| WO | WO 2004/092662 | 10/2004 | ............... B60H 1/00 |
| WO | WO 2007/131659 | 11/2007 | |
| WO | WO 2013/034913 | 3/2013 | ............... F24D 3/00 |

OTHER PUBLICATIONS

English translation of the International Preliminary Report on Patentability (Chapter I of the Patent Cooperation Treaty), dated Jun. 13, 2017, which was issued by the International Bureau of WIPO in Applicant's corresponding international PCT application having Serial No. PCT/EP2015/077311, filed on Nov. 23, 2015.

Written Opinion of the International Searching Authority, in English, dated Mar. 4, 2016, which was issued by the International Bureau of WIPO in Applicant's corresponding international PCT application having Serial No. PCT/EP2015/077311, filed on Nov. 23, 2015.

International Search Report, in English, dated Mar. 4, 2016, which was issued by the International Bureau of WIPO in Applicant's corresponding international PCT application having Serial No. PCT/EP2015/077311, filed on Nov. 23, 2015.

First Office Action (in German), dated May 15, 2017, issued by the German Patent Office for Applicant's corresponding German Patent Application No. DE 10 2015 004 524.5, filed Apr. 8, 2015.

METHOD AND DEVICE FOR CYCLICAL OPERATION OF A THERMOELECTRIC CELL ARRANGEMENT

The invention relates to a method for the cyclic operation of a thermoelectric cell arrangement according to claim 1 and to a device provided for this purpose according to claim 5.

Thermoelectric cell arrangements are known. These devices are used to convert heat into electrical energy. In contrast to the Seebeck effect, for example, in which a voltage is generated by a constant temperature gradient in a thermoelectric material, the generation of a voltage in a thermoelectric cell takes place by changing the temperature of the cell over time. A plurality of such cells may be interconnected to form a battery arrangement. In such a battery arrangement, a voltage is generated by a temperature change. Thermoelectric cells can thus be characterized by a cyclic mode of operation.

The performance of such cyclic processes is limited by the heat transport, which is necessary when changing the temperature at the thermoelectric cell. Moreover, such cells are mostly based on electrolyte systems with a relatively high specific heat capacity. A not insignificant amount of heat is therefore required to carry out the temperature change in the thermoelectric cell. Furthermore, the thermoelectric cell arrangement must necessarily be cooled in each half-phase, so that charge can be removed again in a subsequent heating phase. This considerably reduces the efficiency of the overall process. In order for such thermoelectric cells to be used for the generation of electrical energy, the temperature change must be carried out effectively. Conventional heating or cooling systems such as heating coils or compression cooling units are designed for constant operation and also require a constant supply of electrical energy. For heating thermoelectric cells, it is also possible in principle to use waste heat from low-temperature plants for example. However, it lacks a suitable temperature drop for effective cooling of the cell.

It is thus the object of the invention to provide a method and a device with which a thermoelectric cell arrangement can be operated efficiently.

The object is achieved by a method of a thermoelectric cell arrangement having the features of claim 1 and with regard to the device aspect with a harvester device having the features of claim 5.

According to the invention, the method for cyclically operating a thermoelectric cell arrangement is carried out by periodically changing a temperature of the thermoelectric cell arrangement, wherein the thermoelectric cell arrangement is thermally coupled to a cyclically operated sorption heat pump. The following process steps are carried out cyclically:

First, a thermal coupling of the thermoelectric cell arrangement takes place during a cooling phase with a cold side of the sorption heat pump. In a second method section, a thermal coupling of the thermoelectric cell arrangement takes place during a heating phase with a hot side of the sorption heat pump. The process then returns to the first process step.

According to the invention, the method is therefore based on the idea of using a sorption heat pump for heating and cooling the thermoelectric cell arrangement and to heat and cool the thermoelectric cell cyclically by means of the sorption heat pump so as to effect the necessary temperature change in the cell and thus enable the extraction of electrical energy in the form of an alternating voltage from the cell in a quasi continuous manner.

According to the invention, the thermoelectric cell arrangement is therefore subjected to the working cycle of a sorption heat pump. Through the realisation of the temperature change by means of the sorption heat pump, the temperature changes in the thermoelectric cell succeed in a comparatively short time. In addition, the sorption heat pump as such does not require an additional supply of electrical energy. The particular advantage of the combination of sorption heat pump and thermoelectric cell arrangement also results in particular from the fact that both components are operated cyclically. The heat energy to be supplied to the cell arrangement and to be removed therefrom is pumped in or pumped out by the sorption heat pump, wherein the alternating temperature levels of the cell can be optimally generated also from existing low-temperature heat by means of the heat pumping effect.

In one embodiment of the method, the sorption heat pump is cyclically coupled to an external heat reservoir or an external cooling reservoir via a changeover unit. In conjunction therewith, the sorption heat pump contains a heating and cooling element acting as a cyclic hot or cold side, depending on the switching state of the changeover unit. The heating and cooling element generates the temperature change in the thermoelectric cell arrangement via a thermal coupling.

By means of such a method configuration, the process sequence is considerably simplified in particular with regard to the thermal contacting of the thermoelectric cell arrangement and the sorption heat pump. The cell arrangement is cyclically heated or cooled here by one and the same process component.

The thermal coupling between the thermoelectric cell arrangement and the sorption heat pump is carried out in a first embodiment via a heat transfer medium circuit which cyclically acts as a heating or cooling circuit.

The heat transfer medium circuit is operated in a configuration in the form of a heat pipe, in particular a heat pipe arrangement. In this case, evaporation and condensation of a heat transfer medium takes place in a closed tube, which thus absorbs heat as evaporation heat or delivers it as condensation heat and thus conducts the heat transport.

In another embodiment, the thermal coupling between the thermoelectric cell arrangement and the sorption heat pump is carried out by a direct solid-conducting heat contact.

At the device side, a harvester device is provided for obtaining electrical energy by means of a thermoelectric cell arrangement, in which the thermoelectric cell arrangement has a thermal coupling with a sorption heat pump, wherein via the thermal coupling a temperature change occurring in the cycle of the working cycle of the sorption heat pump can be effected in the thermoelectric cell arrangement.

In one embodiment, the sorption heat pump has an adsorber which can be connected cyclically to an external heat source or an external heat sink via a changeover device, and a heating and cooling element cyclically operable as an evaporator and condenser, wherein the heating and cooling element is thermally coupled to the thermoelectric cell arrangement.

In one embodiment, the thermal coupling between the thermoelectric cell arrangement and the heating and cooling element is designed as a thermally conductive fastening which directly connects the thermoelectric cell arrangement to the heating and cooling element. In such a configuration, the cell arrangement can be structurally integrated into the heating and cooling element to a high degree.

In a further embodiment, the thermal coupling between the thermoelectric cell arrangement and the heating and cooling element is formed via a heat transfer medium circuit. It can be designed in particular in the form of a heat pipe, in particular in the form of a heat pipe arrangement.

In one embodiment, the external heat reservoir is a waste heat source or a thermal collector.

The cooling capacity of the sorption heat pump, which relates to the mass of a thermoelectric cell arrangement, is in particular 40-120 kJ/kg, preferably 60-100 kJ/kg. It can be assumed that a sorption heat pump cooperates in each case with two thermoelectric cell arrangements.

Figure 2:
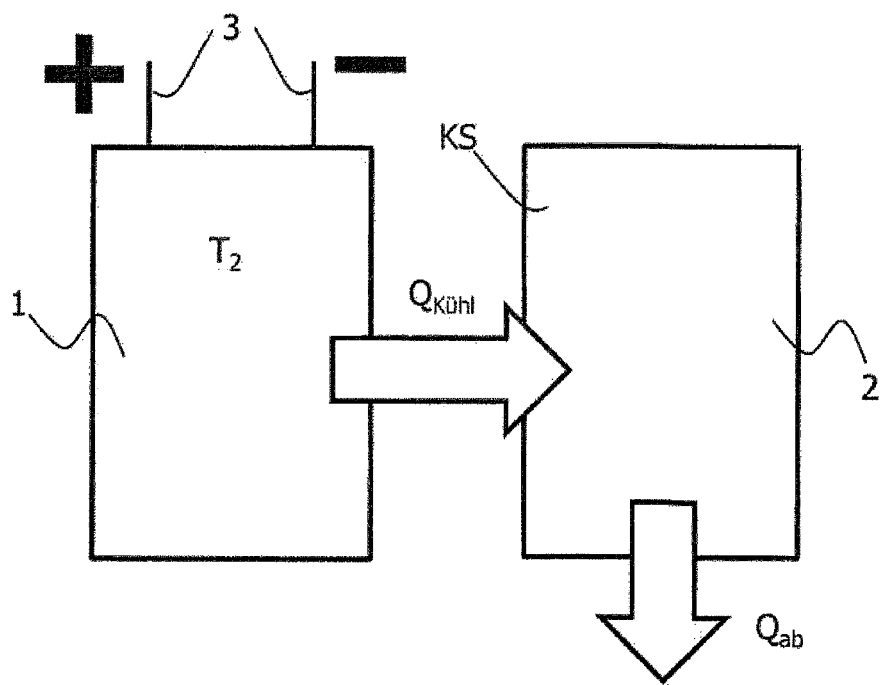
Figure 3:
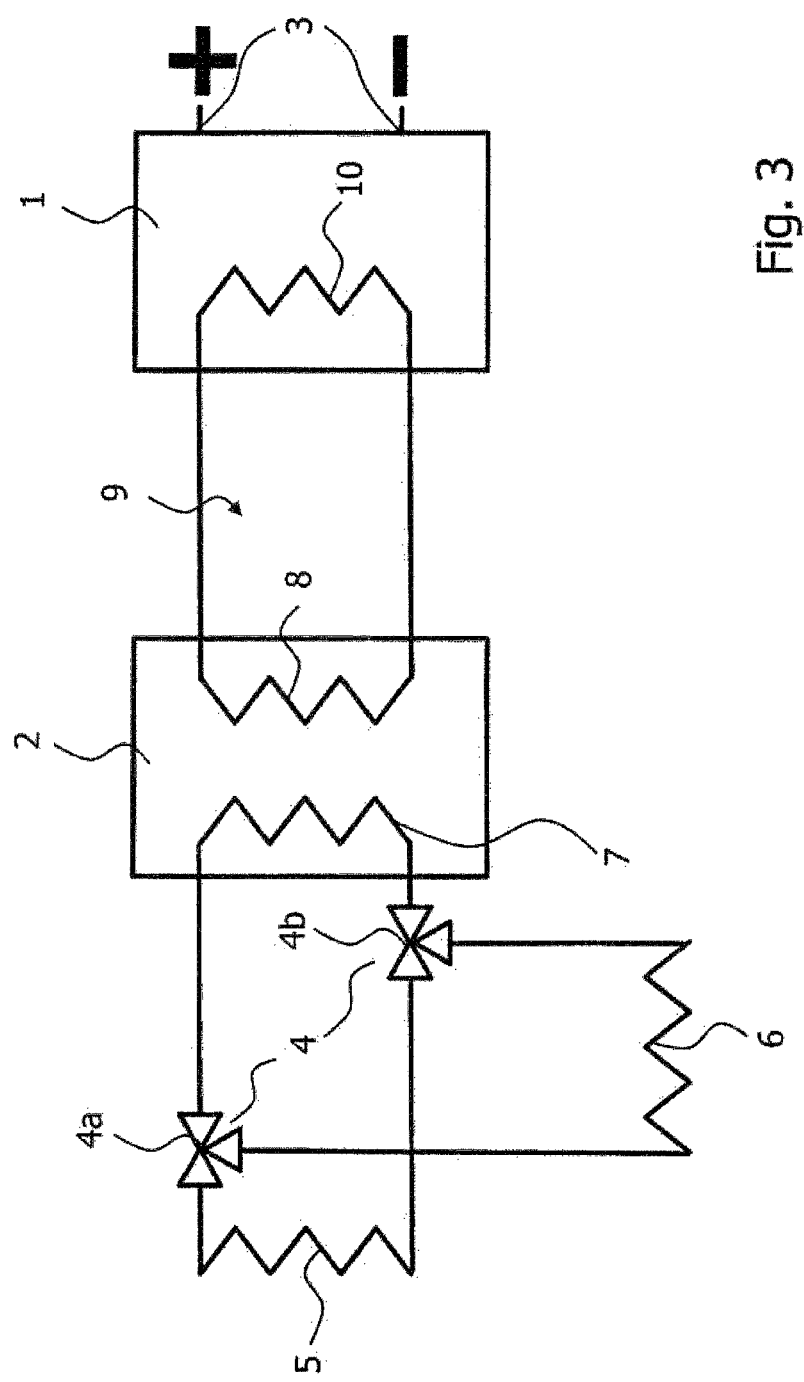
Figure 4:
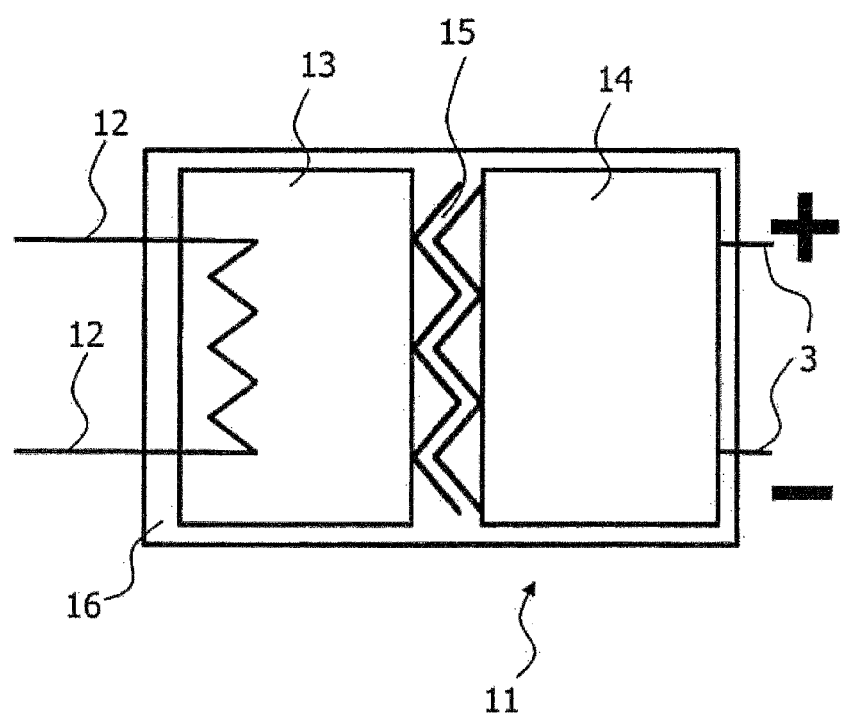
Figure 5:
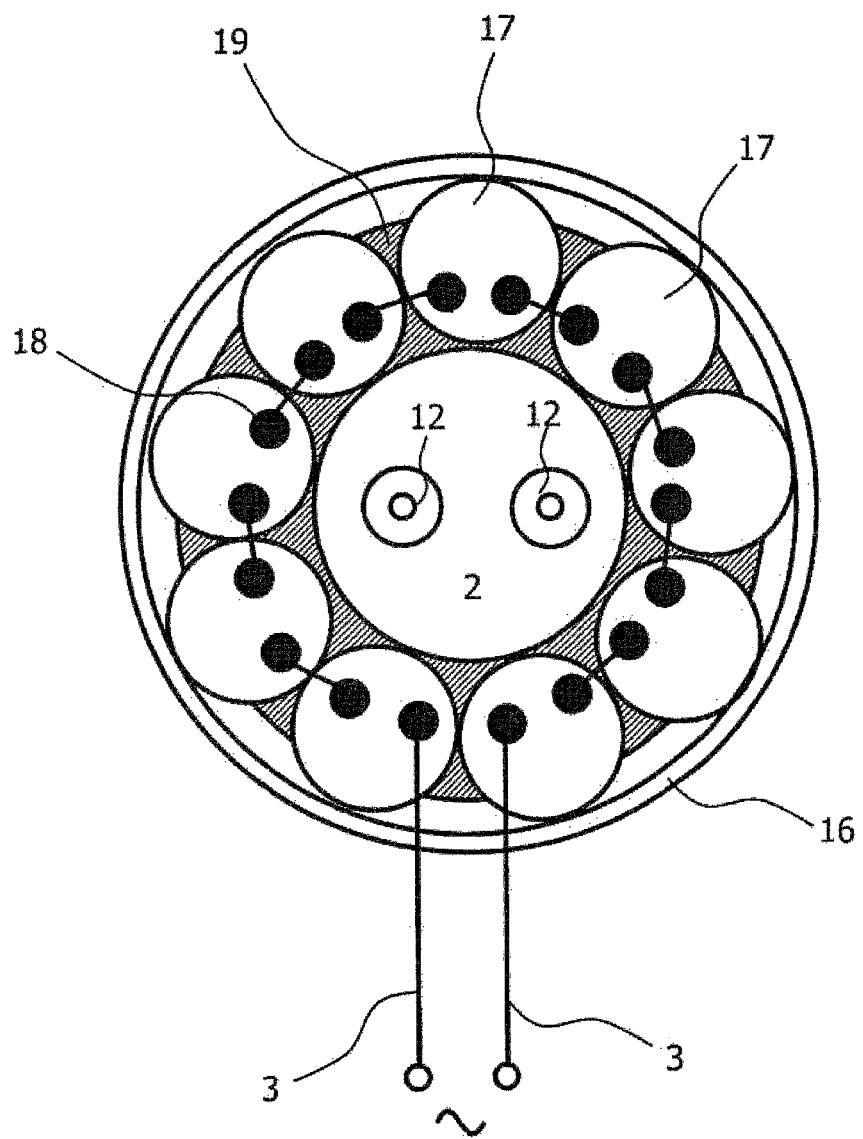

The method according to the invention and the device according to the invention are described in more detail below with reference to exemplary embodiments. FIGS. 1 to 5 serve the purpose of illustration. The same reference numerals are used for the same or equivalent parts, wherein:

FIG. 1 shows a basic process sequence between the sorption heat pump and the thermoelectric cell during a heating phase, FIG. 2 shows a basic process sequence between the sorption heat pump and the thermoelectric cell during a cooling phase, FIG. 3 shows an exemplary circuit diagram, FIG. 4 shows a schematic representation of an integrated arrangement of a sorption heat pump and a thermoelectric cell, FIG. 5 shows a schematic representation of a further embodiment of an integrated harvester device.

Figure 6:
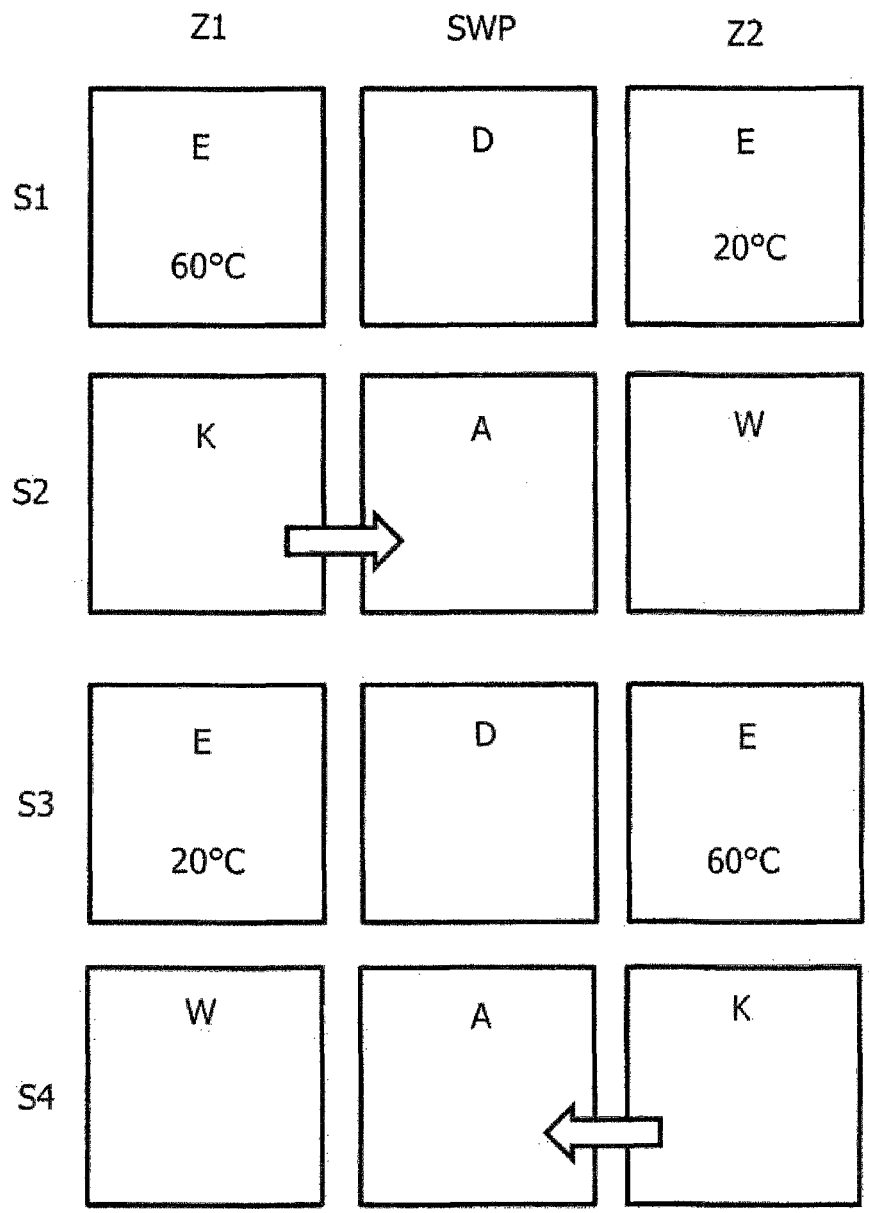

FIG. 6 is table illustrating the operating states and the operating sequences of the thermoelectric cell arrangement formed in accordance with the present invention.

FIGS. 1 and 2 show exemplary process sequences during a heating and a cooling phase of the working cycle according to the invention. The process is carried out between a thermoelectric cell arrangement 1 and a sorption heat pump 2. In the present case, the sorption heat pump is driven by the supply of waste heat $Q_0$. This concerns a sorption heat pump operating in the low-temperature range. In a first half cycle, the sorption heat pump receives the waste heat $Q_0$. This absorbed heat is partly released at a hot side WS of the sorption heat pump 2 and serves thereby to heat the thermoelectric cell arrangement 1 to a specific temperature $T_1$. In a subsequent second semi-cycle, the heat pump conveys the waste heat to a re-cooling device and receives, via its cooling side KS, an additional heating quantity $Q_{Kühl}$ from the thermoelectric heating cell arrangement. This is discharged together with the waste heat $Q_0$ as the discharge heat $Q_{ab}$ to a cooling reservoir. In this case, the temperature of the thermoelectric cell arrangement is lowered from the initial temperature $T_1$ to the now lower temperature $T_2$. During this lowering of the temperature, charge separation takes place within the thermoelectric cell, so that a voltage can be tapped off at its terminals 3.

This second half cycle is followed by the first half cycle again, in that waste heat $Q_0$ is again taken up by the sorption heat pump 2 from the waste heat source. The thermoelectric cell arrangement is now again brought into thermal contact with the hot side WS of the sorption heat pump 2. As a result, the temperature inside the cell arrangement increases from the temperature $T_2$ again to the higher temperature $T_1$. This temperature increase now leads to a renewed charge separation within the thermoelectric cell, so that now a voltage, but this time with an opposing connection polarity, can be tapped again at their terminals 3. As a result, the first half cycle now also provides electrical energy at the thermoelectric cell. The described sequence is then continued as often as desired with the second half cycle. The thermoelectric cell arrangement thus emits an alternating voltage in alternation of the half cycles.

An exemplary circuit diagram of an arrangement for carrying out the method is shown in FIG. 3. The circuit diagram contains the thermoelectric cell arrangement 1 with its electrical connections 3 as well as the sorption heat pump 2. This is coupled to a heat reservoir 5 and a cooling reservoir 6 via a changeover device 4 consisting of the controlled valves 4a and 4b. A waste heat source is in particular suitable as a heat reservoir, wherein the cooling reservoir, for example, forms a heat exchanger with the ambient air. The heat transport between the sorption heat pump 2 and the reservoirs takes place by means of switched heat transfer medium circuits, which are indicated in the illustration by corresponding lines.

Via the valves 4a and 4b and the heat transfer mediums circulating in the heat transfer medium circuits, the reservoirs 5 and 6 are brought into thermal contact in an alternating manner with an adsorber 7 within the sorption heat pump. Depending on the temperature applied, this causes a desorption or an adsorption of a working medium contained within the sorption heat pump. In the course of the desorption and adsorption processes, the working medium is condensed on a heating and cooling element 8 acting simultaneously as a condenser and evaporator, or it is transferred by this element from the condensed state back into the gas phase. The heat released during the condensation or the heat absorbed during the evaporation of the working medium is fed or withdrawn via a thermal coupling 9 to the thermoelectric cell arrangement 1. As a result, the temperature change described above is effected within the thermoelectric cell arrangement, which finally leads to the described cyclic electrical alternating voltage at the terminals 3.

In the present configuration, the heating and cooling element 8, depending on the corresponding half-phase of the process sequence, thus forms both the hot and cold side of the sorption heat pump 2. The thermal coupling between the sorption heat pump and the thermoelectric cell arrangement is therefore very simple. In the present example, a closed heat transfer medium circuit is used for the thermal coupling between the sorption heat pump and the thermoelectric cell arrangement. The heat supplied to the thermoelectric cell arrangement or the heat extracted therefrom is exchanged with the components of the thermoelectric cell arrangement via a heat exchanger 10 integrated therein. It is also possible to provide a flow around the electrical components of the thermoelectric cell arrangement with the heat transfer medium, wherein the electrical components are encapsulated and are located in a heat transfer medium bath. A particularly intensive thermal contact between the fluid heat carrier and the corresponding cell units within the thermoelectric cell arrangement is important in each case.

Advantageous with regard to the thermal contacting between the heating and cooling element of the sorption heat pump on the one hand and the thermoelectric cell arrangement on the other hand is its structural configuration which is as close as possible and in which a high integration of the two components can be realised with the shortest possible heat conduction paths and the lowest possible heat losses. A schematic example is shown in FIG. 4.

The drawing shows an integrated harvester 11 with external heat connections 12 for thermal contact with external heat and re-cooling reservoirs and electrical connections 3 for extracting the electrical energy generated by the harvester. The harvester contains an integrated sorption heat pump 13 and an integrated thermoelectric cell arrangement 14. Between the integrated components, there is a heat conducting device 15 which ensures an intimate thermal contact. The heat conducting device 15 consists in particular of the heating and cooling element of the sorption heat pump, which in this case is thermally connected directly to the integrated thermoelectric cell arrangement.

This entire integrated arrangement is encapsulated and externally provided with a thermal insulation 16 to minimise the heat losses of the entire arrangement. A particularly advantageous arrangement is one in which the sorption heat pump is located at the centre of the integrated harvester, while the integrated thermoelectric cell arrangement is grouped around and includes the sorption heat pump. As a result, the integrated cell arrangement is heated or cooled from the inside. A corresponding embodiment is shown in FIG. 5. The illustration shows an integrated harvester arrangement from the integrated sorption heat pump 13 with the external heat connections 12. It is surrounded here by a thermoelectric cell arrangement consisting of nine individual cells 17 which are connected in series by means of electrical contacts 18 and thus result in a battery arrangement. The individual cells are embedded in a heat conducting medium 19. In this case, the heat conducting medium can either be a solid body with good heat conducting properties, e.g. an aluminium or copper construction, or also a fluid, in particular a liquid. This arrangement is also surrounded by an outer thermal insulation 16.

A great advantage of the method according to the invention and especially of the embodiment shown in FIG. 3 and FIG. 4 or FIG. 5 is that the sorption heat pump as such does not require the supply of additional electrical energy. The process of heat pumping is performed exclusively by the thermally induced desorbing and adsorbing of the working medium at the adsorber and the condensation and evaporation associated therewith on the combined condenser and evaporator of the heat pump. This heat pumping process is driven by the externally supplied waste heat, which is thus absorbed and converted into electrical energy. This conversion process thus does not require any additional electrical energy. A comparatively small switching current, which can be easily driven by the voltage applied to the thermoelectric cell arrangement, is required solely for the changeover unit 4 with the valves 4a and 4b.

As a measure for the device coordination between the sorption heat pump and the thermoelectric cell arrangement, it is considered to place in relation the capacity for the cooling or the heating by the sorption heat pump to the thermal mass of the thermoelectric cell arrangement which has to be cooled or heated by means of the sorption heat pump.

An example of this is shown schematically in FIG. 6 by means of a tabular representation. The columns of the table each represent the operating states present in a first thermoelectric cell Z1, a sorption heat pump SWP arranged therebetween, and operating states present in a second thermoelectric cell Z2. The lines of the tabular representation show the operating sequences of the overall system from the first and second thermoelectric cells and the sorption heat pump in individual operating steps S1 to S4.

In principle, a sorption heat pump can temper two thermoelectric cells because it can be activated exactly when the thermoelectric cells are discharged isothermally. This is the case when the desorption takes place in the sorption heat pump. In the tempering phases of the cells, i.e. when adsorption processes take place in the sorption heat pump, only one of the two thermoelectric cells must always be cooled, while the second cell is heated directly by the heat source. Charge reversals occur both in the cooling of the one cell and in the heating of the other cell. Both cells are operated quasi in a push-pull mode.

In the operating step S1, a desorption D takes place in the sorption heat pump SWP. Both thermoelectric cells Z1 and Z2 are in this case in an isothermal state in which both carry out a discharge process E, e.g. via an electrical load, which is not shown here. The thermoelectric cell Z1 has a temperature of 60° C. for example, and the thermoelectric cell Z2 has a temperature of 20° C.

In the operating step S2, the sorption heat pump SWP performs an adsorption phase A. On the one hand, a cooling K of the thermoelectric cell Z1 takes place, while a heating W occurs in the thermoelectric cell Z2. The cooling of the one cell as well as the heating of the other cell leads in each case to a polarity reversal and charging, so that upon completion of the operating step S2 electrical energy can be taken from both cells.

In the operating step S3, both cells Z1 and Z2 are again in the isothermal state. The cell Z1 now has a lower temperature of 20° C. for example as a result of the preceding cooling, whereas the cell Z2 has been brought to a higher temperature of 60° C. for example. In this state, the discharge process E can again take place in both cells and thus a removal of electrical energy. The sorption heat pump in this step again passes through a desorption phase D.

In the operating step S4, the sorption heat pump again passes through an adsorption phase. The thermoelectric cell Z1 is thereby heated and the thermoelectric cell Z2 is cooled, so that the operating step S1 can again be carried out subsequently.

Under these conditions of operation of different thermoelectric cells in push-pull mode, the cooling capacity of the sorption heat pump only requires about half of the thermal capacity of the thermoelectric cells. If a comparatively high heat capacity for water is assumed as the electrolyte of the thermoelectric cells, then the total mass of the cells without the housing requires about 85 kJ of cooling capacity per kg for the tempering from 60° C. to 20° C.

The method according to the invention and the device for carrying out the method have been explained with reference to exemplary embodiments. Further embodiments are possible in the context of action by persons skilled in the art. These are obtained in particular from the sub-claims.

LIST OF REFERENCE NUMERALS

1 Thermoelectric cell arrangement
2 Sorption heat pump
3 Electrical connections
4 Changeover device
4a First changeover valve
4b Second changeover valve
5 Heat reservoir
6 Cooling reservoir
7 Adsorber
8 Heating and cooling element
9 Thermal coupling
10 Heat exchanger
11 Integrated harvester
12 Heat connections
13 Integrated sorption heat pump
14 Integrated thermoelectric cell arrangement
15 Heat conducting device
16 Thermal insulation 17 Thermoelectric single cell
18 Electrical contact
A Adsorption
D Desorption
E Discharging
K Cooling
W Heating
S1 First operating step
S2 Second operating step
S3 Third operating step
S4 Fourth operating step
SWP Sorption heat pump

The invention claimed is:

1. A method for cyclically operating a thermoelectric cell arrangement, that is thermally coupled to a cyclically operated sorption heat pump, which comprises the step of:
   periodically changing the temperature of the thermoelectric cell arrangement, which comprises the sub-steps of:
      lowering the temperature of the thermoelectric cell arrangement by thermally coupling the thermoelectric cell arrangement during a cooling phase with a cold side of the sorption heat pump, whereby due to a lowering of the temperature charge separation with a first polarity takes place within the thermoelectric cell, and
      increasing the temperature of the thermoelectric cell arrangement by thermally coupling the thermoelectric cell arrangement during a heating phase with a hot side of the sorption heat pump, whereby a temperature increase leads to a renewed charge separation with a second polarity within the thermoelectric cell, the second polarity being opposite the first polarity,
   wherein electrical energy is generated by cyclically performing the steps of lowering the temperature of the thermoelectric cell arrangement and increasing the temperature of the thermoelectric cell arrangement.

2. A method according to claim 1, characterized in that the sorption heat pump is cyclically coupled to an external heat reservoir or an external cooling reservoir via a changeover unit, wherein the sorption heat pump, depending on the switching state of the changeover unit, contains a heating and cooling element acting as a cyclic hot or cold side, which generates the temperature change in the thermoelectric cell arrangement by way of a thermal coupling.

3. A method according to claim 1, characterized in that the thermal coupling between the sorption heat pump and the thermoelectric cell arrangement takes place via a heat transfer medium circuit which cyclically acts as a heating or cooling circuit.

4. A method according to claim 1, characterized in that the thermal coupling between the sorption heat pump and the thermoelectric cell arrangement takes place via a heat pipe device.

5. A method according to claim 1, characterized in that the thermal coupling between the thermoelectric cell arrangement and the sorption heat pump is carried out by a direct solid-conducting heat contact.

6. A harvester device for obtaining electrical energy, which comprises: a thermoelectric cell arrangement and a sorption heat pump, wherein the thermoelectric cell arrangement has a thermal coupling with the sorption heat pump, wherein the sorption heat pump operates in a working cycle and cyclically increases and decreases the temperature of the thermoelectric cell arrangement via the thermal coupling, and wherein electrical energy is only generated by the cyclical change of the temperature of the thermoelectric cell arrangement.

7. A device according to claim 6, characterized in that the sorption heat pump comprises an adsorber which can be switched cyclically to an external heat reservoir or an external cooling reservoir via a changeover device, and a heating and cooling element which can be operated cyclically as an evaporator and condenser, wherein the heating and cooling element is thermally coupled to the thermoelectric cell arrangement.

8. A device according to claim 7, characterized in that the thermal coupling between the thermoelectric cell arrangement and the heating and cooling element are thermally coupled by a thermally conductive fastening which directly connects the thermoelectric cell arrangement to the heating and cooling element.

9. A device according to claim 7, characterized in that the thermal coupling between the thermoelectric cell arrangement and the heating and cooling element is formed via a heat transfer medium circuit and/or a heat pipe.

10. A device according to claim 7, characterized in that the external heat reservoir is a waste heat source or a thermal collector.

11. A device according to claim 7, characterized in that the cooling capacity of the sorption heat pump, which is based on the mass of a thermoelectric cell arrangement, is 40 to 120 kJ/kg.

12. A device according to claim 11, characterized in that the cooling capacity of the sorption heat pump, which is based on the mass of a thermoelectric cell arrangement, is 60 to 100 kJ/kg.

* * * * *